(12) United States Patent
Aviel et al.

(10) Patent No.: US 6,894,435 B2
(45) Date of Patent: May 17, 2005

(54) METHOD AND DEVICE FOR RASTERING SOURCE REDUNDANCY

(75) Inventors: David Aviel, Tel-Mond (IL); Jimmy Vishnipolsky, Petach Tikva (IL); Radel Ben-Av, Rehovot (IL)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/289,882

(22) Filed: Nov. 6, 2002

(65) Prior Publication Data

US 2004/0085024 A1 May 6, 2004

(51) Int. Cl.[7] .......................... H05B 37/00; G21G 5/00
(52) U.S. Cl. ...................... 315/167; 250/398; 250/400; 250/492.3
(58) Field of Search ................................ 315/161, 168, 315/167, 169.3; 250/341.1, 341.4, 341.7, 353, 360.1, 391, 395, 396 R, 398, 400, 492.3

(56) References Cited

U.S. PATENT DOCUMENTS

| | | | | |
|---|---|---|---|---|
| 5,363,021 A | * | 11/1994 | MacDonald | 315/366 |
| 5,430,292 A | * | 7/1995 | Honjo et al. | 250/310 |
| 5,557,105 A | * | 9/1996 | Honjo et al. | 250/310 |
| 5,864,142 A | * | 1/1999 | Muraki et al. | 250/491.1 |
| 5,920,077 A | * | 7/1999 | Oae et al. | 250/492.22 |
| 6,498,349 B1 | * | 12/2002 | Thomas et al. | 250/398 |

FOREIGN PATENT DOCUMENTS

| | | |
|---|---|---|
| EP | 0772221 | 5/1997 |
| WO | WO-0060632 | 10/2000 |
| WO | WO-0135165 | 5/2001 |

OTHER PUBLICATIONS

Search Report, "International Search Report", PCT/US 03/34779, (Oct. 30, 2003).

* cited by examiner

*Primary Examiner*—Thuy Vinh Tran
(74) *Attorney, Agent, or Firm*—Blakely, Sokoloff, Taylor & Zafman (57) ABSTRACT

A method for scanning a specimen 105 with beams 102 of charged particles of a source group. Thereby, a plurality of target points 402 is scanned with a charged particle beam emitted by a source 106 and the same plurality of target points is scanned with at least one further charged particle beam emitted by at least one further source. Further, the charged particle beams from the source and the at least one further source are emitted on the same target point at different times. Additionally, a multiple charged particle beam source and a data feed system are provided. A source array 104 comprises at least one logical emitting unit 106, wherein patterning information is shifted in a shift circuit 140, and redundancy emitting units 106, wherein individual redundancy emitting units obtain patterning information from the shift register.

26 Claims, 8 Drawing Sheets

Fig. 7a  Fig. 7b  Fig. 7c

METHOD AND DEVICE FOR RASTERING SOURCE REDUNDANCY

FIELD OF THE INVENTION

The present invention generally relates to a multiple charged particle beam apparatus and more particularly to a multiple beam lithography system for direct writing. More specifically, the present invention relates to a method for scanning a specimen with beams of charged particles, an array of sources emitting charged particles and a multiple charged particle beam apparatus.

BACKGROUND OF THE INVENTION

Technologies like microelectronics, micro mechanics and biotechnology have created a high demand in industry for structuring and testing specimens within the micrometer or even nanometer scale. On such a small scale, testing or structuring is often done with electron beams, which are generated and focused in charged particles beam devices like electron microscopes or electron beam pattern generators. Charged Particle beams offer superior spatial resolution compared to e.g. photon beams due to their short wavelengths.

For processing of e.g. integrated circuits lithography is commonly used. Thereby, a layer of photoresist is selectively exposed to generate a pattern. Such a pattern is afterwards used for an etch process. For the generation of the pattern on the photoresist optical systems or X-ray systems can be used. These systems, however, have the disadvantage of limiting the pattern resolutions. Further, expensive and sensitive masks have to be used for the pattern generation.

Alternatively e.g. an electron beam can be used to pattern a layer of photoresist. Thereby, a mask can be avoided by scanning the electron beam over the specimen and writing the pattern directly on the photoresist layer. Such systems, however, can not provide sufficient throughput for an industrial production.

Thus, there have been efforts to develop multi-column exposure systems. Such systems comprise arrays of e.g. electron emitters. These systems, however, implicate the following problems. On the one hand, using low-density arrays with deflection and focusing systems for each individual beam, considerable space is required for a small number of beams. Thereby, the throughput is not sufficiently increased. On the other hand, using high-density arrays as e.g. field emitter cathode arrays, the emission behavior fluctuates to an amount that processing parameters are not accurate enough for the applications.

There have been attempts to compensate for the above-mentioned fluctuations. For example, Parker et al. disclosed in patent U.S. Pat. No. 5,637,951 that several field emitter tips are arranged in an array. Thereby, each array corresponds to one pixel. That is, each array of tips emits one electron beam capable of writing on a wafer. Thus, the currents of the individual tips are averaged. However, such a system enlarges the size of one pixel written on a wafer. Further, tips can not be controlled independently. Thus, such an approach can not be considered a sufficient solution for the prior art problems.

SUMMARY OF THE INVENTION

The present invention intends to improve the above devices. According to aspects of the present invention a method for scanning a specimen with beams of charged particles according to independent claim 1 is provided. Further, a charged particle beam source according to independent claim 13, a data feed system according to independent claim 23 and a charged particle beam apparatus according to independent claim 26 is provided.

Further advantages, features, aspects and details of the invention are evident from the dependent claims, the description and the accompanying drawings.

The present invention generally relates to a charged particle beam apparatus, and more particularly to a multiple beam lithography system for direct writing. More specifically, the present invention relates to a method for irradiating a specimen with beams of charged particles, an array of sources emitting charged particles and a charged particle beam apparatus.

According to a further aspect of the present invention, there is provided a method for directing a plurality of charged particle beams of a source array on a specimen surface. Target points are first irradiated by a charged particle beam emitted by an emitting unit. The same target points are afterwards irradiated by at least one further charged particle beam emitted by a further emitting unit. Thereby, the emitting unit emitting a charged particle beam to irradiate a target point first is referred to as a logical emitting unit. The emitting unit for the further charged particle beam is referred to as a redundancy emitting unit.

According to a preferred aspect, the emission of charged particle beams by the source array is synchronized with mechanical and/or field induced motion of the charged particle beams relative to the specimen.

Preferably, the same target points are irradiated with further charged particle beams of further emitting units at least 5 times, more preferably at least 100 times.

Using the method described above, charge of charged particle beams of multiple emitters is accumulated at the same target point. The contribution of the multiple sources to the charge accumulated leads to an averaging of the source characteristic fluctuations.

Thus, the fluctuations of individual field emitter cathode tips can be compensated for by statistical redundancy. Emitting charged particle beams on the same target point "n" times with different emitter tips reduces e.g. the emitter tip location variance, the emitter tips current variance and other fluctuations induced by the emitter characteristics by a factor of square root of "n". Further, the high vacuum requirements for field emitter cathode tips can be relaxed to about $1–10^{-7}$ mbar, since contamination of individual emitter tips can be compensated for by the redundancy. For the above reasons, the requirement for individual emitter tip tuning is reduced and the reliability of the writing head is improved.

Further, since the emitting units emit charged particle beams onto the same target points one after the other, the emission time to one target point (pixel) is increased. Thus it is possible, to realize a feedback control. Due to the feedback option, the synchronization mechanism of the array is able to control which sources are included to what amount in the accumulation of charge at an individual target point.

Therefore, it is preferred if a feedback based on the emission of previous sources is realized. According to an even more preferred aspect, emitting units of different specialized characteristics, e.g. average current, are used. Thus, the amount of charged emitted on an individual target point can be controlled even better.

Within this application the phrase "scanning target points" refers to irradiating a specimen with a charged particle beam, whereby charged particles impinge on the specimen at a plurality of target points (pixels). Thereby, an emitting unit for a charged particle beam to be irradiated on a specimen obtains information to emit the charged particle beam on the target points to form a pattern. According to this pattern charge is be provided onto an individual pixel individually. The pattern can be used to either expose a specimen during a writing process. Alternatively, if a specimen is e.g. tested, only certain areas can be included in a test measurement. Thereby, charging, specimen damage or the like can be avoided in regions, which are not relevant for the test result.

According to an even further aspect of the present invention, there is provided a charged particle beam source. The source comprises a plurality of emitting units. The emitting units emit charged particle beams to form a pattern on the specimen and afterwards shift the respective pattern information in a data storage. Further emitting units obtain this pattern information from the data storage and emit charged particle beams to form the same pattern on the specimen.

The data storage to store the pattern information until a further emitting unit requires the information can be a shift circuit. As an example this shift circuit can be a shift register, a RAM memory, other types of write-able and read-able memories, or the like.

Thus, the present invention has the advantage that the data for e.g. irradiating a pattern on a wafer needs to be stored only until the next emitting unit requires the same data. A respective data storage (register) is required for all emitting units of the array of sources respectively. Since, thereby, the need for data storage is reduced, the data can be stored and manipulated within the source assembly. Thus, the need for data storage compared to a system wherein the data is stored for each emitting unit is reduced. This advantage also applies for the following aspect of the present invention.

According to an even further aspect of the present invention, a data feed system for a charged particle source array is provided. This system comprises memory for storing data used for emitting charged particle beams in a pattern onto a specimen. Further, at least one shift circuit for shifting the data from one emitting unit to a further emitting unit is provided.

The memory for storing the data before first provided to an emitting unit is an external memory in form of a RAM, ROM, a disk storage or the like. In general, this external memory is combined with a processing unit. The unit for externally providing the data for controlling emitting units is referred to as a data path.

Generally, the emitting units might be denoted as follows. One of the emitting units emits a charged particle beam onto an individual target point first. This emitting unit is a so-called logical emitting unit. All further emitting units, whose charged particle beams impinge onto this individual target point afterwards, are so-called redundancy emitting units. However, this differentiation has to be made for individual target point.

Thereby, it is possible that an emitter acting as a logical emitting unit during a first time slot acts as a redundancy emitting unit during a successive time slot.

According to an even further aspect of the present invention, a charged particle beam apparatus is provided. This apparatus makes use of a source array and a data feed system according to the present invention. Additionally deflection, focusing and specimen stage moving equipment as well as the respective controllers are provided.

Preferably, a charged particle beam apparatus is a charged particle beam writing system used e.g. for lithography. Even more preferably a multiple charged particle beam apparatus is a direct e-beam writer.

The invention is also directed to apparatus for carrying out the disclosed methods including apparatus parts for performing each described method steps. These method steps may be performed by way of hardware components, a computer programmed by appropriate software, by any combination of the two or in any other manner. Furthermore, the invention is also directed to methods by which the described apparatus operates. It includes method steps for carrying out every function of the apparatus.

BRIEF DESCRIPTION OF THE DRAWINGS

Some of the above indicated aspects and other more details of the invention will be described in the following description and partially illustrated with reference to the figures. Therein.

DETAILED DESCRIPTION

Without limiting the scope of protection of the present application in the following, the charged particle beam devices will exemplarily be referred to as a direct electron beam writer. It can still be applied in apparatuses using other sources of charged particles.

Thus, the embodiments can refer to phrases like "writing a pattern". Thereby, it should be understood in general that charged particle beams are irradiated on a plurality of target points (pixels) of a specimen. The pixels on the specimen form a pattern. The irradiation might in general be used for a patterning process or for any kind of inspection process.

Figure 1:
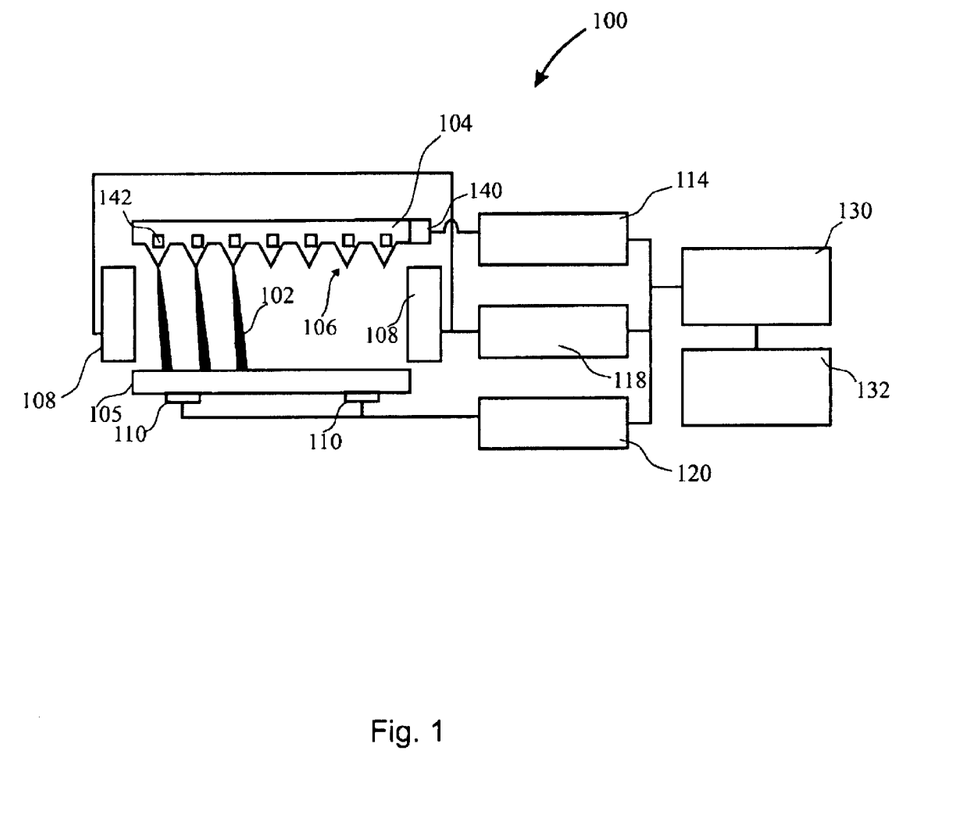
FIG. 1 shows a block diagram of a multi beam apparatus according to the present invention.

FIG. 1 shows a schematic drawing of an electron e-beam writer suitable for carrying out the present invention. An array or group of sources (emitting units) 104 emits a plurality of electron beams on a specimen 105. The emittance of the individual emitting units comprising an emitter tip 106 is controlled by source control 114. Source control 114 is further responsibly for the control of the memory 142 of each emitting unit. The memory corresponding to each emitting unit is for example used for time multiplexing and, thus referred to as time multiplexing memory. Thus, generally, each emitting unit comprises an emitter tip and a time multiplexing memory. The time multiplexing memory has to be sufficiently small, to be provided behind or next to each emitter tip.

The Deflection unit 108 simultaneously deflects the electron beams. Deflection unit provides e.g. homogeneous magnetic fields, whereby the deflection control unit 118 controls the field strength. Alternatively, electric fields or magneto-electric fields could be used for deflecting the electron beams 102. In order to move the specimen 105, specimen stage 110 is provided. The movement of the specimen stage and subsequently the movement of the specimen can be controlled using the specimen movement controller 120.

Synchronization unit 130 synchronizes the array of sources 104 via source control 114, the deflection of the electron beams via deflection control 118 and the specimen movement via specimen movement control 120. The system is controlled via a user interface or master controller 132.

Specific embodiments of a source assembly comprising the array of sources 104, the shift circuit 140 and the time multiplexing memory 142 will be described with respect to FIGS. 2 to 7. It will be apparent how source control 114 and synchronization control 130 should be used to make advantage of the present invention with an e-beam writer corresponding to FIG. 1.

Figure 2A:
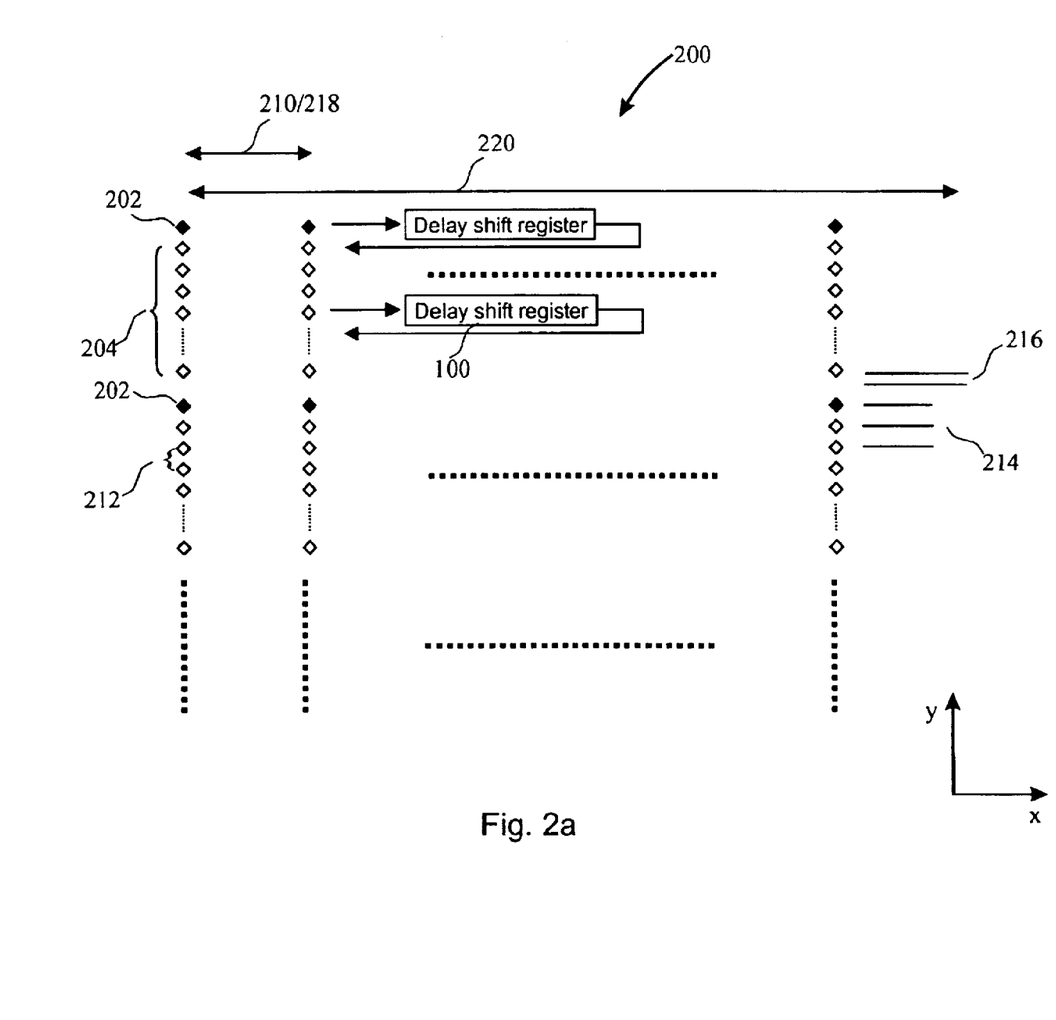
FIGS. 2a and 2b shows a schematic diagram of a source array arrangement explaining the redundancy principle operation in one dimension.
Figure 2B:
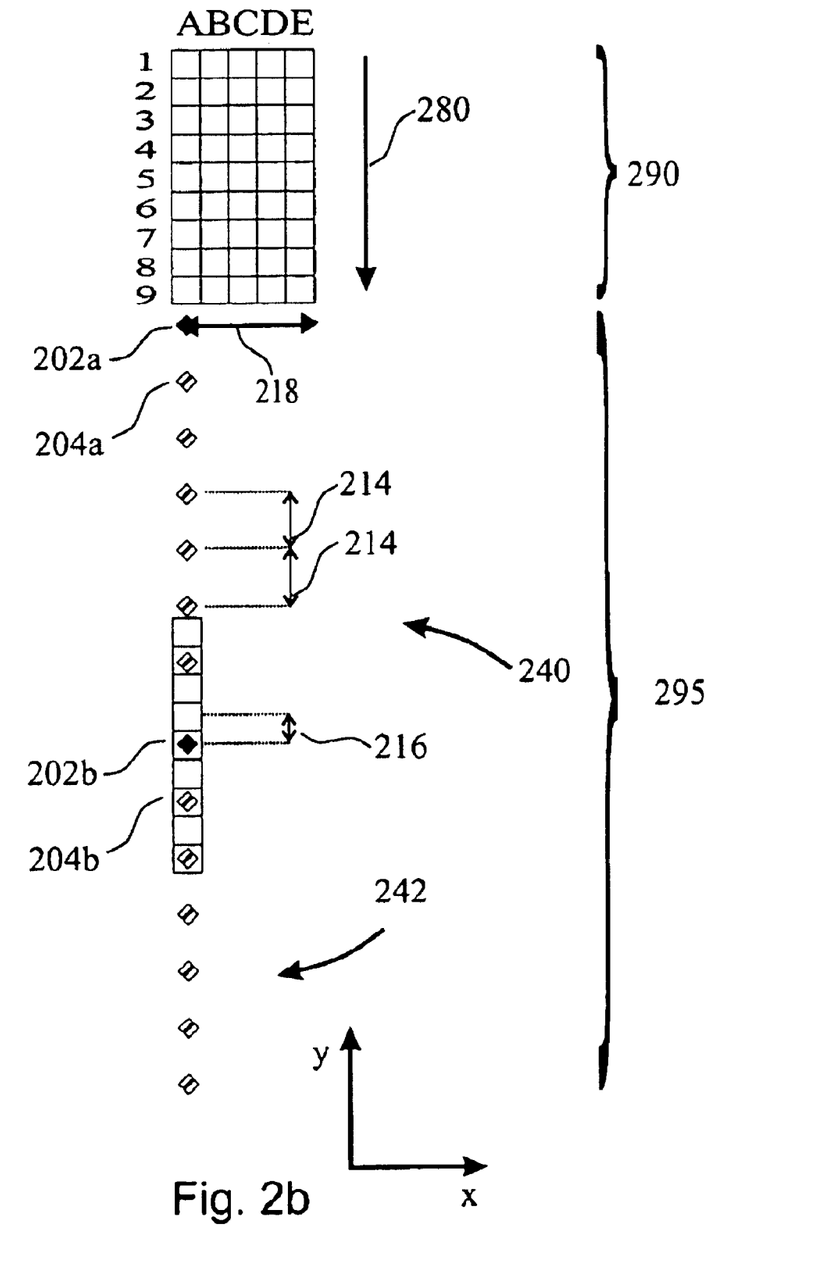

The principal operation of rastering source redundancy is explained with respect to FIGS. 2a and 2b. Thereby, a schematic drawing of a one-dimensional redundancy in y-direction is shown. The group of emitters (202, 204) is arranged in a matrix with rows in x-direction and columns in y-direction. Each column has a scan width 218.

FIG. 2b shows a pixel grid 290 and one column 295 of emitting units consisting of two groups of emitting units 240, 242. Showing a pixel grid 290 (plane of the sample) and an emitter column 295 (plane of the emitters) in the same figure should be understood as a projection of one plane onto the other. The individual pixels of pixel grid 290 are indicated with pixel rows 1 to 8 and pixel columns A to E. Thus, each individual pixel, each row or each column can be addressed by one letter and/or number. During operation of the apparatus 100 (see FIG. 1) the specimen is moved due to the specimen stage 110. In FIG. 2b this is indicated by arrow 280. The emitting units (202, 204) are spaced by a distance 214, referred to as normal tip grid 214. The two groups (240, 242) have an additional space, referred to as the logical emitting unit offset 216. Further, within the example provided, the distance between two pixels is one half of the normal tip grid 214. The relevance of this background will be better understood with the explanations below. Thereby, the procedure of irradiating the pixel grid 290 with a pattern will be described.

The procedure of patterning the pixel grid 290 with a one-dimensional redundancy will now be explained with respect to FIG. 2b. For easier explanation the procedure starts at an arbitrary point in time, called $t_o$. First, the sample is moved by the distance 124 (normal tip grid) in direction 218. Thereby, the first logical emitting unit 202a gets in the position to emit an electron beam to write a pattern onto pixel row 8. The information to pattern one line (width of a column) is first provided by a data path (external memory) to a first emitting unit acting as a logical emitting unit 202. Next, the electron beams of all tips are deflected simultaneously, exemplarily from left to right. Since the first (top) logical emitting unit 202 emits an electron beam that is deflected over the pixel row 8 of pixel grid 290, this line is irradiated by an electron beam once. Thereby, a pattern is formed on line 8.

Afterwards, the specimen is moved by another normal tip grid in direction 280. Therefore, the first logical emitting unit 202a is in the position to emit an electron beam onto pixel row 6 and a further emitting unit, the first redundancy emitting unit 240a, is in the position to emit a further electron beam onto pixel row 8, which was previously irradiated by the first logical emitting unit 202a. The information (patterning data) from the first emitting unit, the logical emitting unit 202a is moved via a shift circuit (delay data storage) to the further emitting unit, the first redundancy emitting unit 204a. The first logical emitting unit 202a obtains new data for irradiating pixel row 6 of pixel grid 290 with a pattern. Having moved the specimen by the normal tip grid 214 (now time $t_1$), the first redundancy emitting unit 204a is at the position the first logical emitting unit 202a was at time $t_0$. The shift circuit 140 provides the data to first redundancy emitting unit 204a with the appropriate delay. Thus, first redundancy emitting unit 204 emits an electron beam to emit the same data (the same pattern) at the positions previously irradiated by logical emitting unit 202 during simultaneous deflection of all electron beams of all emitting units.

After deflecting the electron beams, and thereby, irradiating row 6 and 8, the specimen is again moved by the normal tip grid 214 in direction 280. First emitting units, logical emitting unit 202a gets new data for pixel row 4 of the pixel grid 290. First redundancy emitting unit 204a gets the data for pixel row 6. This data previously used by the first logical emitting unit 202a is provided via a shift register. The next redundancy emitting unit gets the data for pixel row 8. Thus, during deflecting all electron beams, pixel row 4 is irradiated the first time, pixel row 6 is irradiated the second time and pixel row 8 is irradiated the third time.

Repeating this procedures all even pixels rows (8, 6, 4, 2) are on the one hand irradiated by electron beams of the first logical emitting unit 202a and the six subsequent redundancy emitting units. On the other hand, as soon as second logical emitting unit 202b reaches the pixel grid 290, first pixel row 9 is patterned by the electron beam provided by second logical emitting unit 202b. Continuing the same procedure as described above, second logical emitting unit 202b gets new data for patterning the pixel grid 290. This data is then shifted to the subsequent redundancy emitting units. Due to the fact, that the first group of emitters 240 and the second group of emitters 242 are spaced by logical emitting unit offset 216, the second group of emitters 242 irradiate electron beams on the uneven pixel rows (9, 7, 5, 3, 1). In this example the logical emitting unit offset 216 and the distance of the pixel grid is equal. It is obvious that other logical emitting unit offsets 216 can be used to achieve the same result.

Due to this inventive procedure, different emitter tips rewrite the same data at least 10 times, preferably 100 times or more. Thus, the disadvantages of tip emission fluctuation of the prior art can be overcome. Prior art systems which use e.g. field emitter cathodes suffer from the instability and inaccuracy of the individual tips. This applies e.g. to current stability as well as spot projection stability. The prior art tried to solve this problem by e.g. a single tip multi-path approach. Thereby, the same emitter tip rewrote the same data several times. Even though, some statistical improvement could thereby be realized, the difference between "good" and "bad" tips could not compensated for. The differences from one tip to the other is until now inherent to field emitter cathode tips, since the reproducibility of the manufacturing of this emitters suffers.

Exemplarily, if 100 different tips irradiate target points the same data to pattern a specimen at least once, all instabilities and inaccuracies that are introduced by the emitter tips themselves, are reduced by a factor of 10 (square root of 100).

The further preferred parameters within FIG. 2a will be described in the following: The slice width of the group of emitters 200 is denoted with reference number 220. The slice width 220 is given by the scan width multiplied with the number of columns. The tip-x-spacing 210 and the tip-y-spacing 212 (=normal tip grid 214) is given in a manner that scanning of one line, that is deflecting the electron over one line, is synchronized with the movement of the specimen by the tip-y-spacing.

Additionally, the last redundancy emitting unit of the first group of redundancy emitting units in one column is spaced in y-direction to the next logical emitting unit by the normal tip grid 214 plus the logical emitting unit offset 216. The logical emitting unit offset 216 thereby can exemplarily be referred to as the pixel size in y-direction. Thus, after the specimen movement procedure described above is repeated n+1 times (assuming n redundancy emitting units), the second logical emitting unit (in y-direction) is not exactly at the same position as the first logical emitting unit at the time to (time reference see above) but one pixel grid distance in y-direction below the first logical emitting unit. Thus, the second group of emitters (one logical emitting unit and e.g. 99 redundancy emitting units) irradiates different information on different target points but within the same area of the specimen.

From the above examples, it can be seen that the pixel width on the specimen is in general not comparable to the tip x- and y-distances. In general, the tip spacing will be significantly larger than the size of a pixel. As an example, the tip-y-spacing might be 2 μm, the tip-x-spacing might be 52 μm and the pixel grid might be 20 nm. Thus, if the tip position is projected on the specimen (to compare the tip spacing and the pixel size) there are for example 250 pixels in x-direction and 100 pixels in y-direction between each of adjacent tips.

Figure 3:
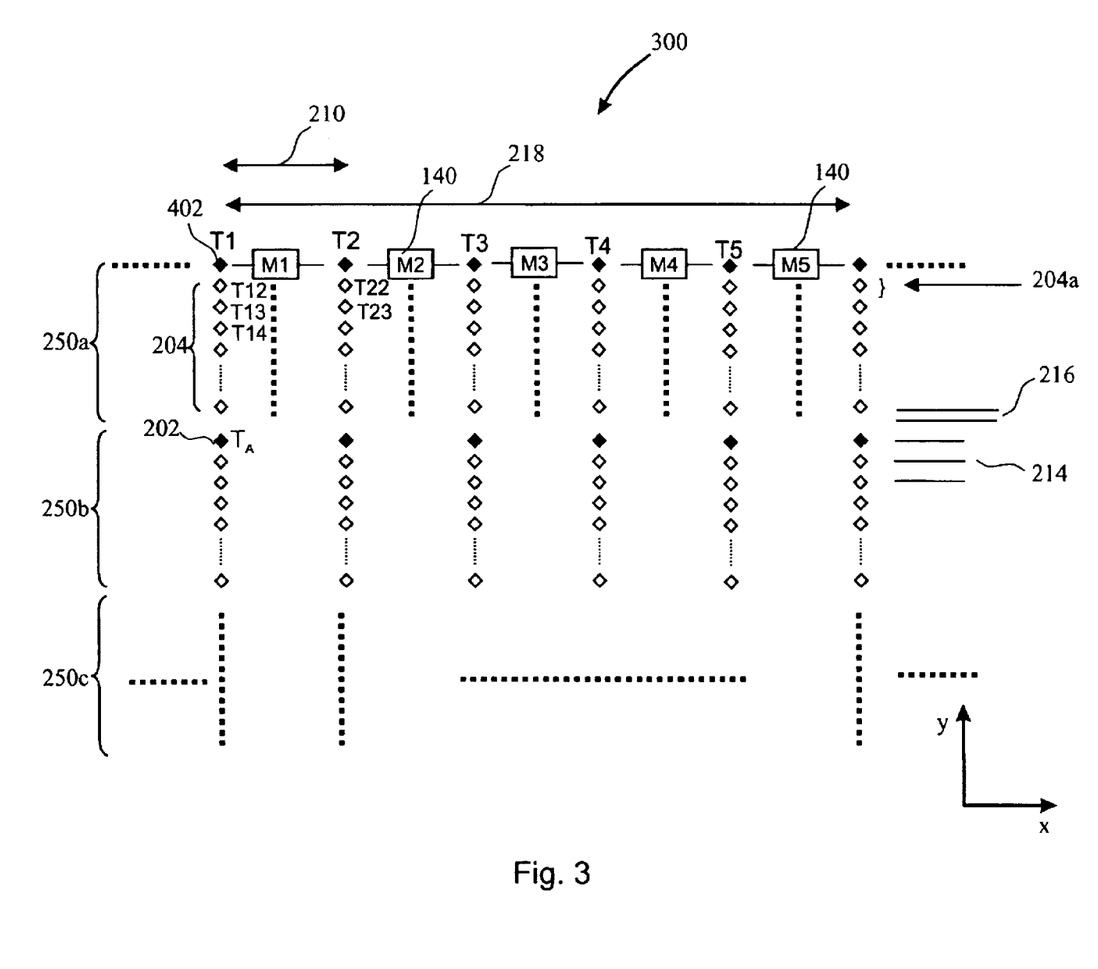
FIG. 3 shows a schematic diagram of a source array arrangement with two-dimensional redundancy.

With respect to FIGS. 3 and 4, a principal example for two-dimensional redundancy will be described. Thereby, it should be assumed that the group of emitters is continued to the left and to the right. Thus, to the left of emitter tip $T_1$ further emitter tips $T_0$, $T_{-1}$ and so on are positioned. In other words, the view presented in FIG. 3 is within the middle of a group of emitter tips.

In the following, the plane of the emitter sources and the plane of the specimen are for some figures projected onto each other. Thus, even though emitter tips might be shown in a graph, it is at the same time referred to pixels, as if these pixels would be located in the plane of the source array. It is apparent that the source array in FIG. 1 is located above the specimen and the pixels-dimension is in general defined on the surface of the specimen. In other words, it is not strictly differentiated between the plane of an emitter tip and the plane an electron beam orthogonal to the sample surface of this emitter tips would impinge on the specimen.

For the two-dimensional redundancy, the scan width 218 exceeds several columns (column width 210). Similar to the one-dimensional example of FIG. 2, all electron beams of the group of emitters 300 are deflected simultaneously over the specimen, exemplarily from left to right. $T_1$ starts irradiating the pixels of a line from emitter tip $T_1$ to $T_2$, while $T_2$ irradiates the pixels from $T_2$ to $T_3$, $T_3$ from $T_3$ to $T_4$ and so on. For the sake of simplicity, it is initially assumed that the data for irradiating a pattern on one line from one emitter tip to the next emitter tip is provided by the respective memories M1 to M5 (memory of shift circuit 140). This shift circuit 140 is practically located outside the area of the array of emitter sources, even though they are sketched between the tips in FIG. 3. However, the shift circuit will still be within the area of the source assembly.

As soon as the electron beam from emitter $T_1$ reaches the former position of emitter tip $T_2$, the data from memory M2 already used for a pattern line of emitter $T_2$, is shifted to tip $T_1$ or memory M1 respectively. Thus, each tip that is a logical emitting unit for patterning the specimen during the irradiating of a first column width 210, acts as a redundancy emitting unit for irradiating subsequent column widths.

After the electron beams have been defected by one column width, emitter tip T1 (until then a logical emitting unit) takes the role of a redundancy emitting unit. The electron beam of emitter tip $T_1$ is deflected further until it reaches the original position of tip $T_3$. The information belonging originally to emitter tip $T_3$ previously has been shifted to M2 and is now shifted to M1 or tip $T_1$ respectively. After the electron beams of each emitter tip have irradiated the scan width of 5 columns, the specimen is moved in y-direction by one normal tip grid 214 and the data from the row of logical emitting units is moved to the first row 204a of redundancy emitting units.

These procedures are repeated until at least all redundancy emitting units have used the original data. While the redundancy emitting units write the data originally written by the logical emitting units, the logical emitting units already started to write new data.

As an example it has previously assumed that the simultaneous deflection of the electron beams of all emitter tips is conducted from left to right. However, it is also possible to conduct the beam deflection back and forth. If the deflection is only conducted from left to right, the second row obtains the data to form a pattern on the specimen as follows. Emitter tip $T_{12}$ gets its data from emitter tip $T_{-4}$ (not shown). This data was originally (first time) written by tip T1. If the scanning is performed back and forth, $T_{12}$ gets its data from $T_1$. In the latter case, the data originally was written by $T_5$.

In the above description, the specimen movement in y-direction has been described as being conducted after one data line has been irradiated. The present invention is however not limited to this example. In case the electron beam deflection is always performed from one side to the other (e.g. from left to right) the specimen-y-movement can be conducted quasi continuously. Thereby, a scan line is slightly declined compared to the x-axis. In such a case, moving the electron beams back to their start position on e.g. the left side has to be compensated for. This movement to the left position can, however, be conducted very fast.

As already described with respect to FIGS. 2a and 2b, the second group of logical and redundancy emitting units is in addition to the normal tip grid spaced by the logical emitting unit offset. Thus, the logical emitting unit $T_A$ (its beam respectively) is after the corresponding y-movement not positioned at the original $T_1$ position. $T_A$ is shifted by the logical emitting unit offset in y-direction and writes one of the pixels in between the original position of $T_1$ and $T_2$.

Figure 4:
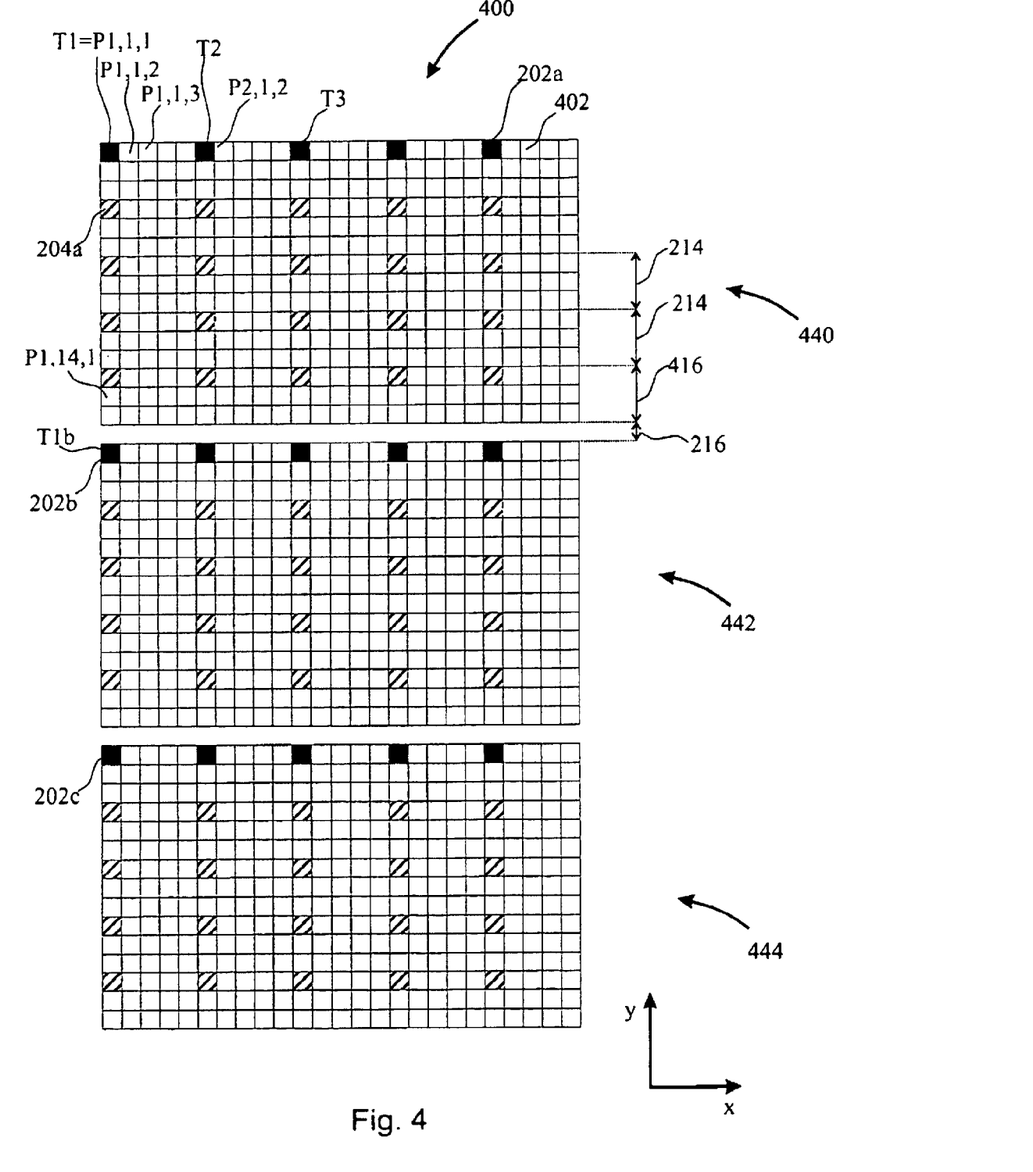
FIG. 4 shows a schematic diagram of an emitter arrangement projected on a pixel raster on the specimen.

This aspect of the inventive idea might be better understood while referring to FIG. 4. FIG. 4 shows three grids on the specimen. Thereby the squares symbolize pixels. As an example, the top pixel grid 400 should be irradiated with a pattern. The two grids below are virtual pixel grids that will be moved upwards by the y-movement of the specimen. Practically this is achieved by moving the specimen and the emitter array relative to each other in y-direction. The emitters correlating to the two bottom grids will start to write when reaching the desired area of the pixel grid 400. The black squares are projections of logical emitting units on the specimen and the striped squares are projections of redundancy emitting units on the specimen. Between each emitter tip column, there are 5 pixels. Between each emitter tip row there are 3 pixels. The scan width is for example assumed to be three columns.

The rows of tips are spaced by the normal tip grid 214 (=tip-y-spacing 212). Each of the three groups is in addition spaced by the logical emitting unit offset 216.

At the time to logical emitting units 202a start to write. The pattern of one column is provided externally as external scanning data via a data path, e.g. in form of a data storage combined with a processing unit. Emitter tip starts writing one column by irradiating an electron beam, namely pixels P1,1,1 to P1,1,5. The numbering used for Px,y,z is x=tip column number, y=pixel row number, z=pixel column number (y<=15, z<=5 for the example of FIG. 4). At the same time emitter tip $T_2$ irradiates pixels P2,1,1 to P2,1,5 etc.

Thereby, it is within the scope of the present invention that the respective emitting unit obtains the data for the respective 5 pixels at once or one after the other. As will be seen with respect to FIG. 5, it is however, preferred to get the scanning data quasi continuously and obtain the patterning information one pixel at a time.

After writing one pixel the patterning data is shifted to a shift circuit. The shift circuit can be a shift register with a memory to store the data obtained by one emitting unit until the next emitting unit requires the data. After writing the pixels, the information is shifted via a shift circuit from $T_2$ to $T_1$, from $T_3$ to $T_2$ etc. This is repeated until the scan width of three columns has been irradiated.

Afterwards, all beams are moved to their original position, the specimen is moved by one normal tip grid 214 and the data originally belonging to emitter tip $T_i$ is moved via a shift circuit (delay data storage) to redundancy emitting unit tip $T_{i,2}$. As already mentioned, the movement of the specimen, the beam deflection and the writing of the scanning data are synchronized with each other. For the sake of easier explanation, the individual steps are described as if they are conducted one after the other. Practically, however these steps can be synchronized quasi-continuously.

After the movement by the normal tip grid 214, the first row of redundancy emitting units 204a ($T_{i,2}$) irradiates the row previously irradiated by the row of logical emitting units 202a. Further, logical emitting units 202b moved within the area to be irradiated. Due to the logical emitting unit offset emitter tip $T_{1b}$ is now at pixel P1,14,1 and irradiates the respective line of pixels (target points).

After writing this line, the specimen is again moved by the normal tip grid 214. The first row of Pixels is re-written the second time (written the third time) by redundancy emitting units $T_{i,3}$. Pixel row no. 14 is written the second time by redundancy emitting units $T_{i,2b}$ and pixel row no. 11 is written the first time by emitter tips $T_{i,b}$.

After moving the specimen 6 times by the normal tip grid in y-direction, logical emitting units 202c start to write their information in pixel row no. 15.

If in the above example, the pattern area would exceed the area of the pixel by such an amount that all emitter tips irradiate target points with respective data at the same time, the following amount of shift memory would be required. Pattern information of pixel P2,1,1 would have to be stored (after used by $T_2$) until this information would be written by $T_1$. In the meantime, however, also information P2,1,2 to P2,1,5 would have to be stored. Thus, for the five pixels in one row of a column five bits data storage would be required for each emitting unit.

Having this in mind, it can be understood in general terms how much shift memory 140 is required for the present invention. After e.g. $T_2$ has irradiated an electron beam according to the 1-bit information of its original position, this 1-bit (=1 pixel) information has to be stored until this data is shifted to emitter tip $T_1$. This applies for all pixels that are irradiated by emitter tip $T_2$ while scanning from position $T_2$ to $T_3$. Thus, if for example, the column width is 2 μm and the pixel grid is 20 nm, there are 100 pixels which emitter tip $T_2$ irradiates while the electron beam is deflected from $T_2$ to $T_3$. This 100 bit have to be stored until they are shifted to emitting unit $T_1$. Therefore, 100 bit shift data storage has to be provided for each emitting unit. In the case of 1 million emitting units this will be 100 Mbit of data storage that has to be provided at the same time. Compared to an embodiment of two-dimensional redundancy with 5 columns and 19 rows of redundancy emitting unit, a prior art system for storing the data for the entire scanning data line within each tip requires a factor 5 more data storage for each line and a factor of 20 more data storage for each row of redundancy emitting units. Thus, for such an embodiment, the required data storage size could be reduced at least a factor of 100 by the present invention.

Using FIG. 4 as an example (however with a quasi infinite pattern size), 5*75=375 bits shift memory would be required. Since every line is written 5 times using a scan width of 3 columns in the above example every pixel is written 15 times (not taking into account effects at the edge of the pattern, pattern assumed to be quasi infinite). Thus, inaccuracies and instabilities introduced by the emitter tips can be reduced by a factor of ca. 3.9.

With respect to FIG. 4 a further aspect of the present invention should be described in form of an example. As already mentioned, each pixel is irradiated 15 times in the example of FIG. 4. Thus, the amount of charge to produce the pattern adds up for each pixel respectively. Since the charge is not provided during a short time, but by rewriting the same pixel again and again, there is enough time to make use of a feedback control. Thereby, for each pixel the amount of charge already provided on the pixel is measured. If a defined amount of charge C should be provided to each exposed pixel and the charge provided to each pixel is measured, it might be possible that due to fluctuations the amount of charge is already provided after 14, 13 or less emitting units have irradiated an individual pixel. Thus, due to a feedback control it is possible that the last emitting units (e.g. 14 and 15) are not triggered by the synchronization control triggering the emitters via source control to provide any charge on the respective pixel anymore.

According to this aspect it is even more preferred, if there are different types of redundancy emitting units provided. This aspect will in the following also be described by an example. This example should, however, not be understood as limiting the scope of the invention, but as explaining the general idea. Referring to the example of FIG. 4 there are 15 emitting units irradiating one pixel one after the other. If e.g. the first 9 emitting units are of a type emitting about 1.5 to 3.0 nA and the other 6 emitting units are of a type emitting 0.5 to 1.0 nA, the following procedure can be realized. To provide e.g. a charge of 0.2 fC to an exposed pixel first the 1.5–3.0 nA emitting units are used, until a charge of 0.14 fC is provided. Then the 0.5–1.0 nA emitting units are used until the feedback control measured a charge of 0.19 fC. Thus, due to the usage of a feedback control, charge could be provided with an accuracy of 5 rel.–%.

This aspect of the present invention, namely the feedback control preferably combined with different types of emitting units, can either be used to further increase the current stability or to reduce the number of redundancy emitting units required in order to achieve a given current stability.

The above examples and aspects referred to the inventive idea of statistical source (emitting unit) redundancy. These examples should not be understood as limiting to the specific embodiments, as can be seen from further examples. In general, the invention relates to a method for irradiating a specimen with a plurality of charged particle beams emitted by a source group. Further, it relates to a charged particle source for a plurality of charged particle beams. Generally, there is at least one logical emitting unit. The logical emitting unit irradiates a plurality of target points (pixels) with a charged particle beam emitted by the at least one logical emitting unit. Further, there are at least 10 redundancy emitting units. The redundancy emitting units (in general each) irradiate the same plurality of target points with charged particle beams emitted by the at least 10 redundancy emitting units.

Thereby, the patterning information is shifted from one emitting unit to a subsequent emitting unit via a delay shift circuit.

Thereby, it is preferred if the source redundancy has a magnitude of at least 50, more preferably of at least 100. The irradiation of the target points is preferably conducted in scan lines having at least a width of 2 adjacent source columns, more preferably of at least 5 adjacent source columns.

For the above aspect, it is further preferred to have time multiplexing memory corresponding to each emitting unit. Thereby, time multiplexing of the patterning information provided from the shift circuit is enabled. This has the advantage that the number of data lines required to provide the group of emitting units with data can be reduced.

A preferred tip grid distance (x- and y-direction) is between 0.2 and 5 $\mu$m. Further, it is preferred to arrange different groups of emitting units in a way that each group writes on at least one pixel row.

According to a further preferred aspect of the present invention, different types of redundancy emitting units are incorporated. It is even more preferred, if the of redundancy emitting units differ in their average emission current and the charge provided to individual target points is controlled.

In order to write a pattern on a specimen or the like, it is in addition preferred if moving the specimen, deflecting the plurality of charged particle beams and controlling individual emitting units to emit a charged particle beam is synchronized.

Making use of this invention, according to the state of the art, it is not possible to provide the shift circuit (delay data storage) in the same region of the source assembly as the emitting units themselves. This is, due to the fact that data storage according to the state of the art cannot be manufactured sufficiently small. Thus, the shift memory is located outside the area of the source array. This might be implemented differently in the future, in case memory size will further decrease. However, from the present point of view, data lines have to be attached to the source array to provide the individual emitting units with information from the shift circuit. Thereby, also limitations due to the technology available have to be considered. These limitations refer to the line width for integrated circuits that can currently be manufactured. Thus according to the present invention, an inventive data feed system has to be used in order to realize the inventive source redundancy.

Figure 5:
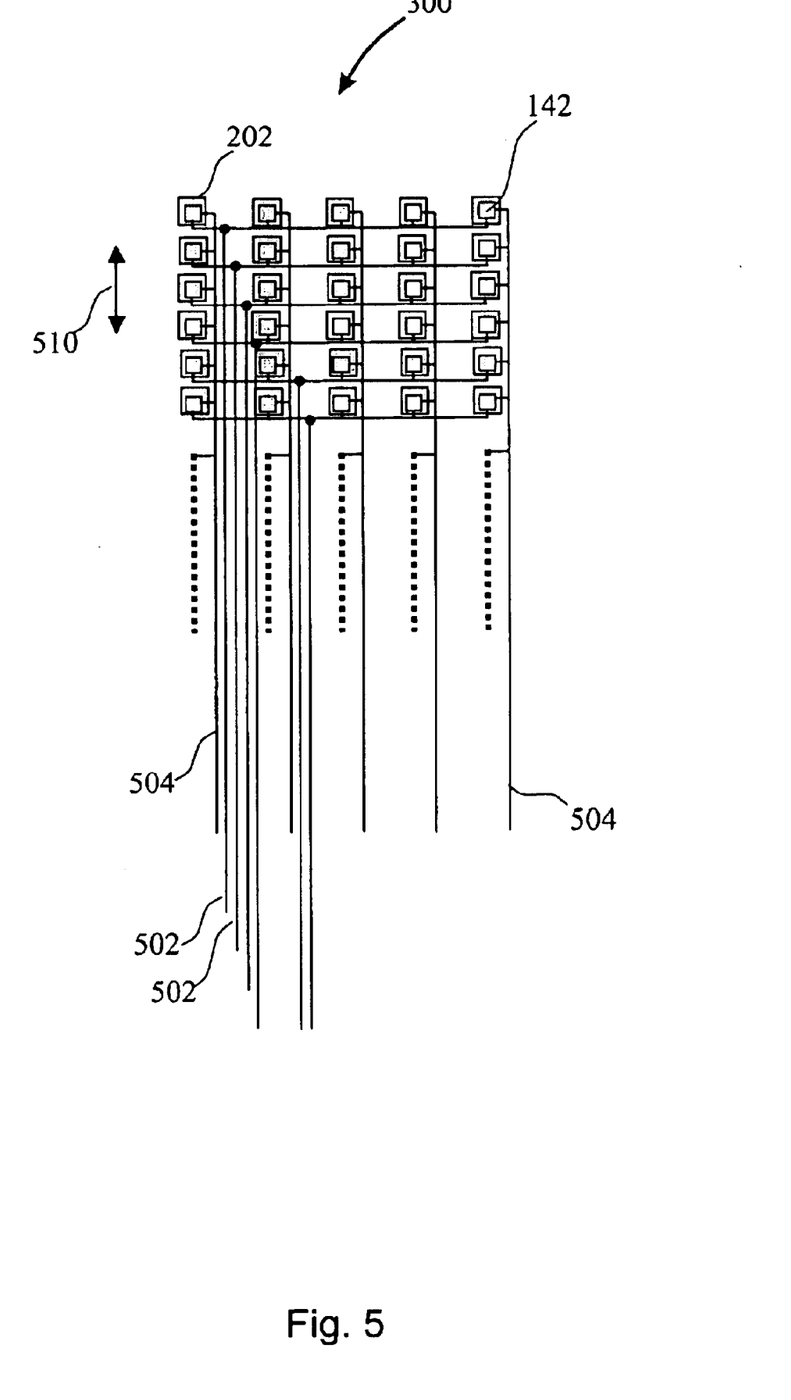
FIG. 5 shows a block diagram of a source arrangement with the data line connections.

The data feed system will now be described with respect to FIGS. 5 and 6. A group 300 of hundred emitting units is indicated in FIG. 5. As mentioned above, the shift memory is located outside the area of the emitting units. Thus, for each group 300 of hundred emitting units hundred data lines would be necessary. Due to the limitations according to which integrated circuits can be manufactured, there is not sufficient room to provide each emitting unit with a data line.

Therefore, it is necessary for the inventive data feed system to include means for time multiplexing. Thereby, generally each emitting unit is e.g. equipped with 1 bit of time multiplexing memory 142. Each row of five emitting units is provided with one time multiplexed data line. Thus, the 5×20 array (group of hundred emitting units) requires twenty data lines 502. In order to time multiplex the data storage within the five columns, further five clock lines 504 are required. For triggering the writing of the scanning data of all e.g. one million emitting units one further trigger line for all one-million emitting units is required. Thus, for time multiplexing as described below, using five time slots the number of data lines could be reduced by ca. a factor of 5.

According to the above example with 1 bit of time multiplexing memory 142 behind each emitting unit, the procedure of patterning a surface can be conducted according to the following. First, the data lines will be provided with the data, that is the information for irradiating the target points in a pattern, from the shift circuit for the twenty emitting units in the first column. Then the very left clock line 502a corresponding to the very left column is triggered. Thereby, the data for one pixel is written in each of the 1 bit time multiplexing memories 142 corresponding to each emitting unit in the first column. The last two steps can also be conducted vice versa or at the same time. Secondly, the data lines will be provided with the data for one pixel for the second column of 2 lines. The data provided by the shift circuit is written in the time multiplexing memories 142 as soon as the second clock line is trigger. Repeating the above procedure for all columns the data is written in each memory 142 for each emitting unit.

After each emitting unit obtained the information for irradiating or not irradiating the next pixel respectively, the trigger line for the entire source array triggers the electron beam emissions. Thereby, emitter tips emit and electron beams to irradiate the pixels for the present writing step.

Afterwards, the data is shifted back to a shift circuit to be available for the next redundancy irradiation process. The electron beams are moved to the next pixel simultaneously, all time multiplexing memories are provided with the 1 bit information required for the next pixel and the writing of the next pixels is triggered.

As already explained above, the strictly successive description of the individual steps is used for easier understanding only. These steps have to be synchronized, but can partly be conducted at the same time, overlapping time intervals or in a different order respectively.

Further, the usage of 1-bit time multiplexing memory was for illustrating purposes only. Even though 1-bit memories are preferred according to the present invention, it is also possible to use 2-bit time multiplexing memories 142. Then, the data for two successive pixels can be written by the shift circuit in the memory corresponding to each emitting unit. As a result, two pixels can be irradiated after each other without a further time multiplexing step.

The number of bits provided for an emitting unit can also exceed 2 bit. The number of bits of this memory depends on the dimension of memory that can be manufactured according to the state of the art and the writing bit rate into the memory that can be realized.

The fact that the above example can be realized for an entire writing head will be explained with respect to FIG. 6.

Figure 6:
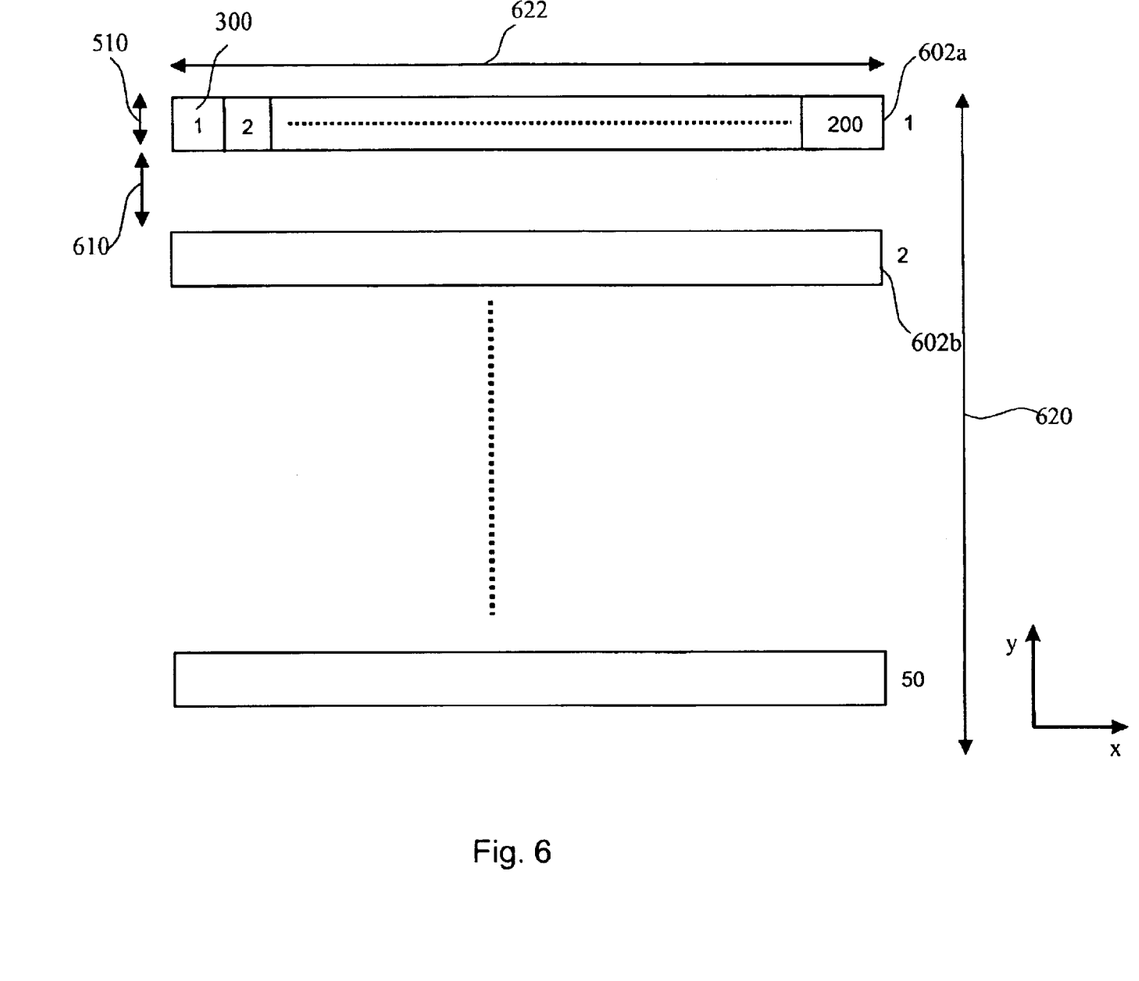
FIG. 6 shows a block diagram of a writing head layout including the wiring area according to FIG. 5.

One embodiment of a writing head is schematically shown in FIG. 6. The width of the writing head 622 is e.g. given by one thousand tips spaced by 2 μm and is thus, 2 mm. Thereby, two hundred groups of emitting units 300 (see FIG. 5) are arranged next to each other. Each group comprises twenty rows of emitting units spaced by 1 μm. Thus, the row of source groups has a height of 20 μm.

The two hundred groups have to be connected to the shift memory external of the writing head. Thereby, one hundred groups can be connected to the left and one hundred groups to the right side of the writing head. Thus, one hundred groups with twenty data lines 502 add up to two thousand data lines that have to be provided to each side. If according to state of the art technology, five lines are used in 1 μm and the lines are located in ten layers, 40 μm are required for the two thousand data lines. If the area behind the group of emitting units (width=20 μm) is used, it is sufficient to leave between each row of groups 602 a wiring area 610 of 30 μm. Thereby, additional 10 μm save margin are provided. As can be seen from this example, it is possible to realize the data feed system described above.

In view of the above, the second row of groups of emitters 602b is spaced about 30 μm below the first row of groups of emitting units 602. Taking into account that there are fifty pixels in y-direction within one tip-y-spacing, it is preferred to have fifty rows of groups of emitting units. For a more detailed explanation thereof, the description corresponding to FIGS. 2b and 4 should be reconsidered. As a consequence the height 620 of the writing head (the source array) adds up to 2.5 mm.

Taking into account the logical emitting unit offset 216 (described with respect to FIGS. 2 to 4), the example described above has an exact distance between the rows of groups of emitters 602, 602b of 30.02 μm. The 20 nm added in addition take into account the exemplary 20 nm pixel grid. For easier realization it is preferred to have the logical emitting unit offset 216 equal to the pixel grid. However, other multiple of the pixel grid can be used as the logical emitting unit offset, as long as all rows of pixels are written at least once by a row of groups of emitters.

The embodiments relating to data feed systems described above should be understood as examples. According to the present invention, these examples should support the aspect of a data feed system, whereby a first group of emitting units (logical emitting units) is provided with data (patterning information). Further, the data is, after using this information by emitters of the first group of emitting units, shifted to a delay data storage. From the delay data storage, the data is further shifted to emitting units of a second group of emitting units (redundancy emitting units).

Thus, the second group of emitting units can re-write the same data and the data has to be stored only for one emitting unit.

Thereby, it is preferred to provide at least 1 bit of multiplexing memory for each emitting unit. Thus, the data shifted from the delay data storage to emitting units can be shifted in a time-multiplexed manner. Thereby, it is even more preferred to reduce the number of data lines compared to the number of emitting units that have to be provided with scanning data.

For all examples above, the description either implicitly or explicitly referred to the fact that the movement of the specimen in y-direction during or for each scanning of the beam is equal to the tip-y-spacing 212 or the normal tip grid 214 respectively. This is not an obligatory feature as can be seen by the following description of FIGS. 7a to 7c. For easier understanding, the principle is explained for a 1-dimensional redundancy in y-direction in FIG. 7.

Figure 7A:
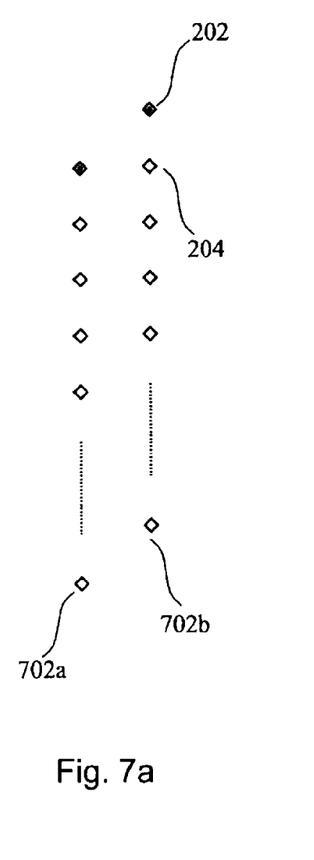
FIGS. 7a to 7c show schematic diagrams of possible writing sequences in case of a one-dimensional redundancy.
Figure 7B:
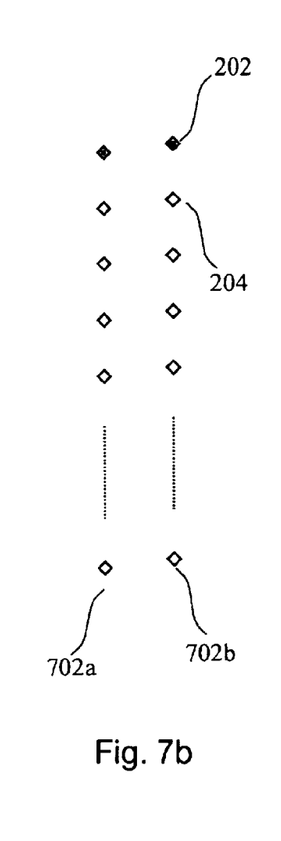
Figure 7C:
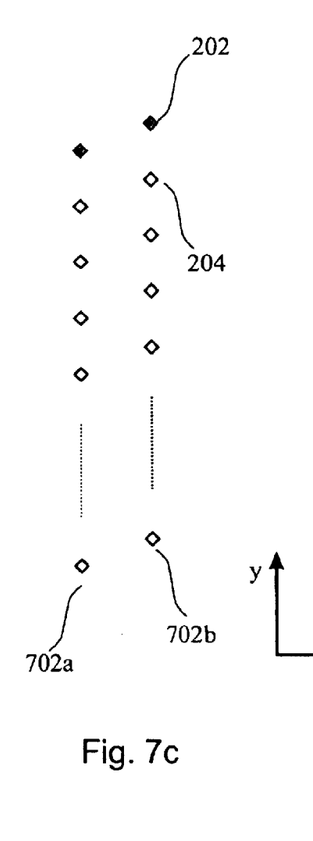

FIGS. 7a to 7c describes three different scenarios regarding the comparison of deflecting the electron beams and moving the specimen in y-direction. In each case the left side 702a shows the y-position before deflecting an electron beam by one scan-width and the right side shows the relative y-position of the same column of emitting units after deflecting an electron beam by one scan-width.

As can be seen in FIG. 7a, the subsequent redundancy emitting unit moved after irradiating one line by the tip-y-spacing in y-direction. Thus, as described above with respect to FIG. 3, the data of one line has to be stored in a shift circuit until the subsequent emitting unit makes use of the same data. For this reason, FIG. 7a can be described as the minimum delay RAM case.

In FIG. 7b the stage speed in y-direction is minimized. Again, the system starts at 702a. Thus, after a electron beam deflection of one data line, the redundancy emitting unit 204 has not yet reached the y-position (see 702b) to rewrite the data originally written by the logical emitting unit 202. Since the logical emitting unit has to write several rows of data until the next redundancy emitting unit is at the position logical emitting unit 202 started at condition 702a, more data has to be stored in a shift memory. In contrast to the scenario of FIG. 7a, however, each row of tips can write the information for more than one row of pixels.

Using the terms of the example of FIG. 4 for the scenario of FIG. 7b: if in FIG. 4 the stage speed would be decreased by one third. Logical emitting units 202a (see FIG. 4) could write every pixel of the pattern to be generated. Thus, the second group 442 and the third group 444 of emitters would not be necessary to write the entire pattern. Yet, the memory of shift circuit that has to be provided for each individual emitting unit would have to be increased by a factor of 3.

Relating to the scenario of FIG. 7c: this case can be considered as an optimized case. Thereby, the stage movement (specimen movement) is not minimized but also not as fast as FIG. 7a. Thus, each individual emitting unit requires more storage for the shift circuit compared to FIG. 7a. However, as long as the size of storage can be provided according to the conditions described above, this optimized case of FIG. 7a provides a higher information density since each pixel writes more often on the specimen.

Without limiting the scope of protection of the present invention a further example of dimensioning a writing head should be given in the following.

According to FIG. 6, the example has 50 rows of 200 groups of emitters. Thus, there are 10,000 groups of emitting units with 100 emitting units each. This makes a total of 1 million emitter tips. The tip-x-spacing is 1 μm and thus, the writing head width (the slice width) is 2 mm. The pixel grid of 20 nm corresponds to 10,000 pixels in x-direction. The tip-y-spacing is 1 μm. Having 50 groups of 20 rows and 30 μm wiring area between each row, the writing head (source array) length is 2.5 mm. For this example the number of sweeps for each charged particle beam of each emitter tip over the same line is considered 1.

It is apparent, that even though the present invention refers to statistical emitter redundancy, it is still possible for all the embodiments and examples present above to re-write the same data with one emitting unit several times.

Within this example the redundancy is 100. In order to calculate the storage required and the time required to write a pattern on a wafer, the following parameters should further be considered. For a sweep width of 10 μm for the electron beams, a sweep time of 10 μs, an area of the wafer of slice length of 200 mm and wafer width of 300 mm and a writing efficiency of 0.75, the following results can be calculated.

The stage speed for the minimum delay RAM scenario (see FIG. 7a) is given by the tip-y-spacing and the sweep time. Thus, the stage speed is 0.1 μm/s.

For each emitting unit a 100 bit (=100 pixels in x-direction) delay memory (shift register) is required. For 1 million emitting units 100 Mbit delay memory is necessary.

Using the width and the length of the writing head compared to the width and the length of the area to be patterned and the stage speed of 0.1 m/s, a time per wafer of 300 s can be calculated. This corresponds to a throughput of ca. 9 wafers per hour.

To realize all that, the data for irradiating the individual pixels has to be provided to each emitting unit. For each emitting unit a sweep width of 10 μm with a pixel grid spacing of 20 nm (500 pixels) have to written within a sweep time of 10 μs. Thus, each emitting unit requires a bit rate of 50 Mbits/sec. If a time multiplexing in 5 time slots is performed, each data line (see FIG. 5) requires a bit rate of 250 Mbits/sec.

As can be seen from the example above, a wafer throughput of 9 wafers per hour with a redundancy of 100 and thus, a system stabilization of a factor 10 can be realized by the invention as described above.

What is claimed is:

1. A method for irradiating a plurality of target points on a specimen with charged particles, comprising:
    a) providing a plurality of emitters, each emitter for emitting a beam of charged particles;
    b) successively directing a first beam of charged particles emitted from a first emitter to the target points; and
    c) successively directing at least a further beam of charged particles emitted from a further emitter, which is different from the first emitter, to said target points;
    wherein the charged particle beams are emitted onto the same target points at different times.

2. A method according to claim 1, wherein the beams of charged particles are directed to the target points by deflecting the beams of charged particles and/or by moving the specimen and the plurality of emitters relative to each other.

3. A method according to claim 2, wherein the directing of the beams of charged particles to the target points and the emitting of the beams of charged particles are synchronized in a manner that the target points, the beams of charged particles are emitted on, form a pattern.

4. A method according to claim 3, wherein the pattern formed by the further emitter is the same pattern as the pattern formed by the first emitter.

5. A method according to claim 4, wherein the emitting of the beams of charged particles is controlled by data provided to memories corresponding to the respective emitters.

6. A method according to claim 5, wherein the data is shifted via a shift circuit from the first memory corresponding to the first emitter to a further memory corresponding to the further emitter different form the first emitter.

7. A method according to claim 6, wherein the step of successively directing at least a further beam of charged particles emitted from a further emitter to said target points is repeated at least 10 times, using different emitters each time, preferably it is repeated at least 100 times using different emitters each time.

8. A method according to claim 7, wherein the beams of charged particles are successively directed over the specimen forming lines, the lines having a width of at least a distance of the columns of the source group.

9. A method according to claim 8, wherein the lines have at least a width of 2 columns of the source group, preferably of at least 5 columns of the source group.

10. A method according to claim 9, wherein the data is provided to the memories in a time-multiplexed manner.

11. A method according to claim 10, wherein the specimen stage is moved in a direction substantially orthogonal to a scanning direction.

12. A method according to claim 11, wherein the charge applied to individual target points is analyzed and additional emission due to the further emitter is stopped as soon as a charged limit has been reached by charge accumulation.

13. A charged particle beam source for emitting a plurality of charged particle beams, comprising:
    a plurality of emitting units, each emitting unit comprises a memory unit and at least an emitter for emitting a charged particle beam, wherein information stored in the memory unit is used to control the emitter; and
    a shift circuit which is used to shift the information stored in the memory unit of a first emitting unit to at least the memory unit of a further emitting unit which is different from the first emitting unit.

14. A charged particle beam source according to claim 13, comprising a memory of the shift circuit to store the information used to action the action of the emitter, wherein charged particle beams emitted by the a plurality of emitters are controlled such that each charged particle beam irradiates the same target point based on the same information.

15. A charged particle beam source according to claim 14, wherein
    at least one emitting unit irradiates a target point first and is denoted as a logical emitting unit (106; 202);
    at least one emitting unit irradiates the target point afterwards and is denoted as redundancy emitting unit (106; 202, 204).

16. A charged particle beam source according to claim 15, wherein the memory of the shift circuit acts as a delay-unit such that charged particle beams emitted by different emitters impinge on the same target point at different times.

17. A charged particle beam source according to claim 16 wherein the memory unit of the emitting unit is a multiplexing memory unit (142) for a time multiplexing, and wherein the memory size is 1 bit or larger.

18. A charged particle beam source according to claim 17 comprising data lines (502), wherein a number of the data lines does not exceed significantly a number of the emitting units divided by a number of time slots of the time multiplexing.

19. A charged particle beam source according to claim 18, wherein rows of emitting units (204a) are spaced to preceding rows of emitting units by a tip grid distance (214) of 0.3 μm to 5 μm.

20. A charged particle beam source according to claim 19, wherein at last one row of emitting units is spaced to preceding row of emitting units by a distance given by the tip grid distance and a multiple of a pixel resolution of the charged particle beam source.

21. A charged particle beam source according to claim 20, comprising at least two types of emitting units, wherein the at last two types of emitting units differ with respect to the emission current.

22. A charged particle beam source according to claim 21, wherein the emitters emit electrons.

23. A charged particle beam apparatus, comprising
    the charged particle beam source (104) emitting charged particles according to any of claims 14 to 22 and a source controller;

a beam deflection unit (108) and a deflection controller (118); and a specimen stage (110) far moving a specimen in a direction substantially orthogonal to a beam deflection direction and a specimen stage control (120).

24. A data feed system for a charged particle source array, comprising a data path for storing information and providing first group of emitting units (106, 202) with information;

at least one shift circuit (140) for shifting the information from at least one emitting unit of the first group of emitting units to at least a further emitting unit;

wherein each emitting unit comprises a memory unit and at least an emitter for emitting a charge particle beam, and wherein the information is stored in the memory unit for controlling the emitter.

25. A data feed system according to claim 24, comprising a time multiplexing memory (142) corresponding to an individual emitting unit (106) for a time multiplexing, wherein the time multiplexing memory has a size of 1 bit or larger and 10 bit or smaller.

26. A data feed system according to a claim 25, comprising data lines (502) for providing the information to the emitting units, wherein a number of the data lines does not exceed a number of the emitting units divided by the number of time slots of the time multiplexing.

* * * * *